(12) United States Patent
Komuro et al.

(10) Patent No.: US 8,637,906 B2
(45) Date of Patent: Jan. 28, 2014

(54) SEMICONDUCTOR INTEGRATED CIRCUIT HAVING POLYSILICON MEMBERS

(75) Inventors: Hideyuki Komuro, Kawasaki (JP); Koji Nozoe, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 306 days.

(21) Appl. No.: 12/484,656

(22) Filed: Jun. 15, 2009

(65) Prior Publication Data
US 2009/0273059 A1 Nov. 5, 2009

Related U.S. Application Data

(63) Continuation of application No. PCT/JP2007/055205, filed on Mar. 15, 2007.

(51) Int. Cl.
*H01L 29/12* (2006.01)

(52) U.S. Cl.
USPC .................................. 257/202; 257/E27.025

(58) Field of Classification Search
USPC .................. 257/202, 533, E27.025, E27.108
See application file for complete search history.

(56) References Cited

U.S. PATENT DOCUMENTS

| | | | |
|---|---|---|---|
| 6,396,123 B1 | 5/2002 | Nagaoka | |
| 6,429,469 B1 * | 8/2002 | Allen et al. | 257/207 |
| 2003/0169101 A1 | 9/2003 | Yamamoto et al. | |
| 2005/0116268 A1 | 6/2005 | Tahira et al. | |
| 2007/0045770 A1 * | 3/2007 | Aoki | 257/516 |
| 2008/0122032 A1 * | 5/2008 | Tu et al. | 257/532 |

FOREIGN PATENT DOCUMENTS

| | | |
|---|---|---|
| JP | 02-069972 A | 3/1990 |
| JP | 2001-118988 A | 4/2001 |
| JP | 2006-073696 | 3/2006 |

* cited by examiner

*Primary Examiner* — Thomas L Dickey
(74) *Attorney, Agent, or Firm* — Arent Fox LLP

(57) ABSTRACT

A semiconductor integrated circuit includes a substrate, an oxide layer formed on an upper surface of the substrate, a plurality of polysilicon members arranged at constant intervals in a matrix on an upper surface of the oxide layer and including at least one first polysilicon member and a plurality of second polysilicon members, and a diffusion layer formed in the substrate under the first polysilicon member and electrically coupled to an interconnect for supplying a first power supply voltage, wherein the first polysilicon member is situated at an outermost periphery of the matrix and electrically coupled to an interconnect for supplying a second power supply voltage, and the plurality of second polysilicon members are situated inside the outermost periphery of the matrix.

11 Claims, 17 Drawing Sheets

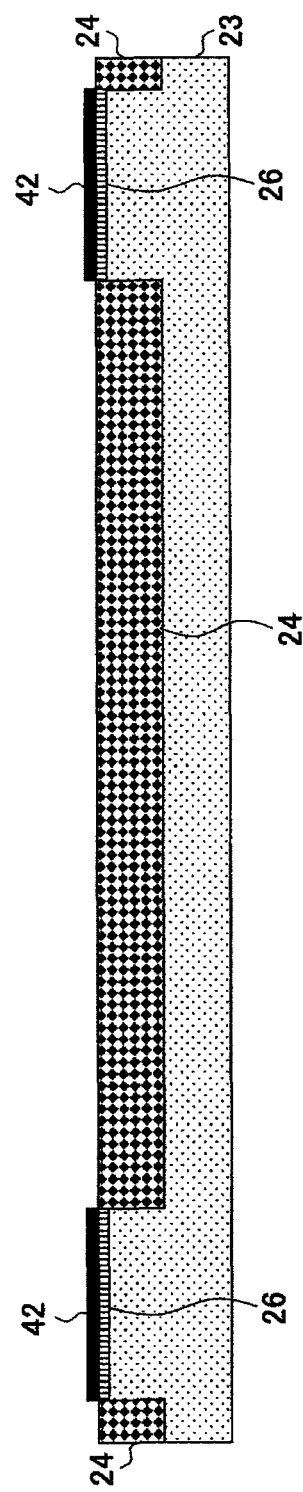

SEMICONDUCTOR INTEGRATED CIRCUIT HAVING POLYSILICON MEMBERS

CROSS-REFERENCE TO RELATED APPLICATIONS

This is a continuation of International Application No. PCT/JP2007/055205, filed on Mar. 15, 2007, the entire contents of which are hereby incorporated by reference.

FIELD

The disclosures herein generally relate to semiconductor integrated circuits, and particularly relate to a semiconductor integrated circuit having a resistor element comprised of a polysilicon member.

BACKGROUND

Polysilicon formed on a field oxide layer may be used as a resistor element for use in the semiconductor integrated circuit. In such a case, a plurality of polysilicon members having the same shape and the same characteristics may be formed as a resistor element unit for the purpose of providing a desired resistance value. The number of polysilicon members connected in series or in parallel is then adjusted to adjust the resistance value. The size and shape of such polysilicon members are required to be highly precise. The polysilicon members may thus need to be manufactured under the same process conditions. Namely, the conditions of photolithography and etching performed during the wafer process may need to be maintained constant with respect to each polysilicon member.

When a plurality of polysilicon members having the same shape are arranged in matrix form at constant intervals, polysilicon members situated in the interior of the matrix are formed under the same process conditions because each of these polysilicon members has identical positional relationships with the surrounding adjacent polysilicon members. The polysilicon members situated at the periphery of the matrix, however, have adjacent polysilicon members only on one side thereof, and, thus, are subjected to different process conditions than the conditions applied to the interior polysilicon members which are surrounded by adjacent polysilicon members on the four sides thereof. Accordingly, the polysilicon members situated at the periphery are provided, as dummy members unused for actual circuit operations, only for the purpose of achieving constant process conditions for the interior polysilicon members.

FIG. 1 is a plan view illustrating an example of a related-art resistor-element unit. FIG. 2 is a cross sectional view of the resistor-element unit illustrated in FIG. 1 as taken along a line A-A'.

As illustrated in FIG. 1 and FIG. 2, a resistor-element unit 10 includes a P-type substrate 13, a field oxide layer 14 formed on the P-type substrate 13, and a plurality of polysilicon members 11 and 12 formed on the field oxide layer 14. The polysilicon members 11 and 12 are arranged in matrix form at constant intervals which are an interval "a" in the vertical direction and an interval "b" in the horizontal direction. The polysilicon members 12 are dummy polysilicon members situated at the periphery of the matrix, and the polysilicon members 11 are resistor-element polysilicon members situated in the interior of the matrix.

The resistor-element polysilicon members 11 situated in the interior of the matrix are formed under the same process conditions because each of these polysilicon members has identical positional relationships with the surrounding adjacent polysilicon members. Accordingly, the resistor-element polysilicon members 11 have the same resistor-element characteristics. A desired resistor value can thus be obtained by connecting a desired number of resistor-element polysilicon members 11 in series or in parallel.

The dummy polysilicon members 12 situated at the periphery of the matrix, however, have adjacent polysilicon members only on one side thereof, and, thus, are subjected to different process conditions than the conditions applied to the interior resistor-element polysilicon members 11 which are surrounded by adjacent polysilicon members on the four sides thereof. Accordingly, the dummy polysilicon members 12 situated at the periphery are formed, as dummy members unused for actual circuit operations, only for the purpose of achieving constant process conditions for the interior polysilicon members.

In the resistor-element unit 10 formed as described above, the dummy polysilicon members 12 situated at the periphery are not used as part of an actual operating circuit, which means that there are needless elements and areas provided in the semiconductor integrated circuit chip. This gives rise to problems such as an increase in chip size and a cost increase.

SUMMARY

According to an aspect of the embodiment, a semiconductor integrated circuit includes a substrate, an oxide layer formed on an upper surface of the substrate, a plurality of polysilicon members arranged at constant intervals in a matrix on an upper surface of the oxide layer and including at least one first polysilicon member and a plurality of second polysilicon members, and a diffusion layer formed in the substrate under the first polysilicon member and electrically coupled to an interconnect for supplying a first power supply voltage, wherein the first polysilicon member is situated at an outermost periphery of the matrix and electrically coupled to an interconnect for supplying a second power supply voltage, and the plurality of second polysilicon members are situated inside the outermost periphery of the matrix.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 6C is a drawing illustrating one of the steps of manufacturing the resistor-element unit of a semiconductor integrated circuit;

DESCRIPTION OF EMBODIMENTS

In the following, embodiments of the present invention will be described with reference to the accompanying drawings.

Figure 1:
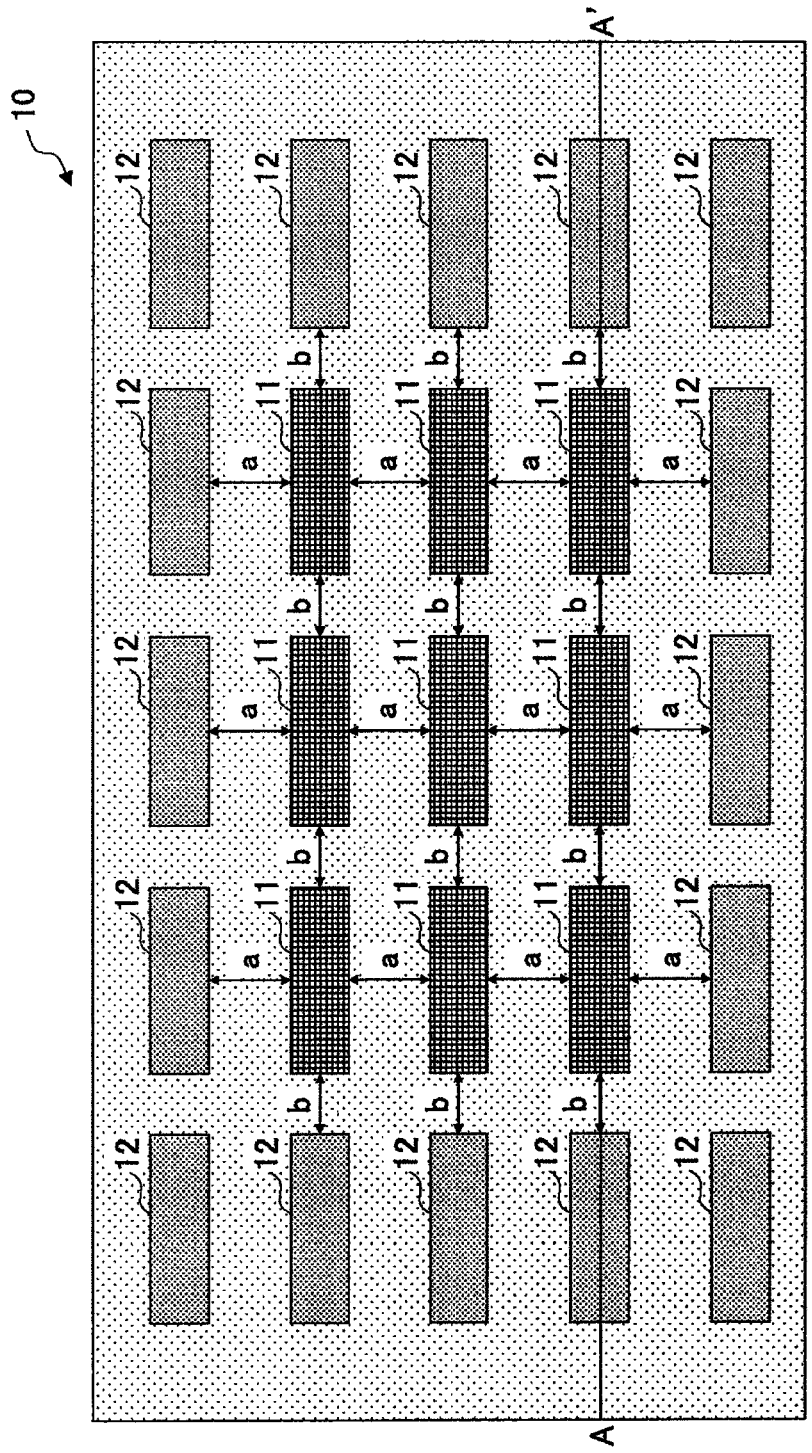
FIG. 1 is a plan view illustrating an example of a related-art resistor-element unit.
Figure 2:
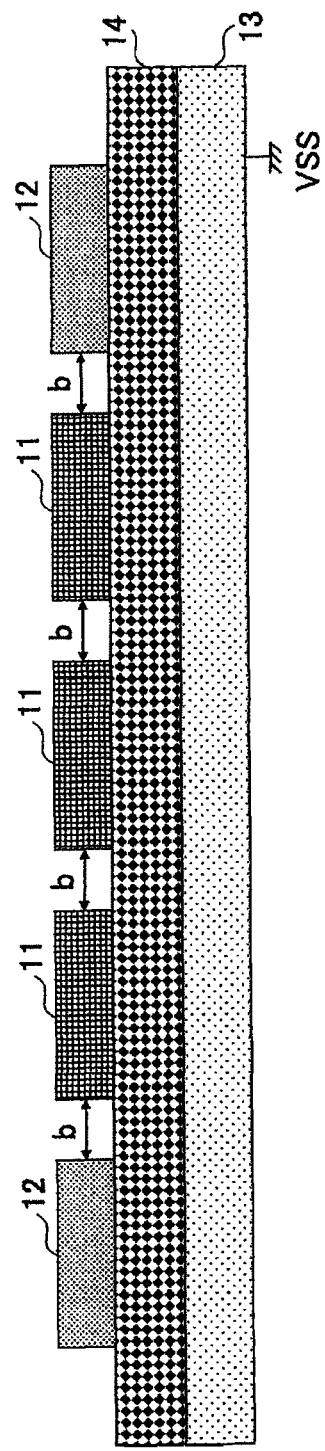
FIG. 2 is a cross sectional view of the resistor-element unit illustrated in FIG. 1 as taken along a line A-A'.
Figure 3:
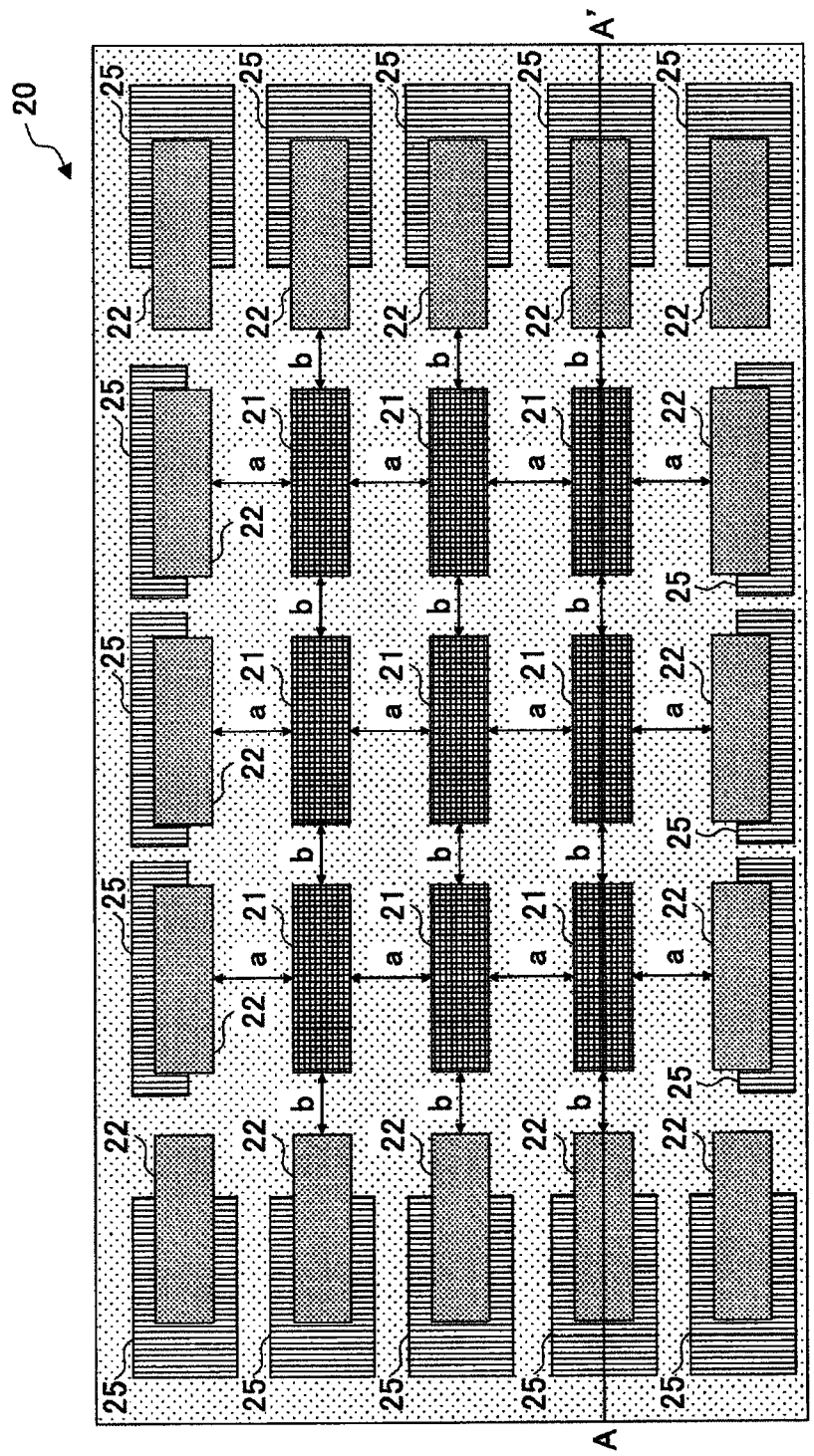
FIG. 3 is a plan view illustrating an example of a resistor-element unit of a semiconductor integrated circuit.
Figure 4:
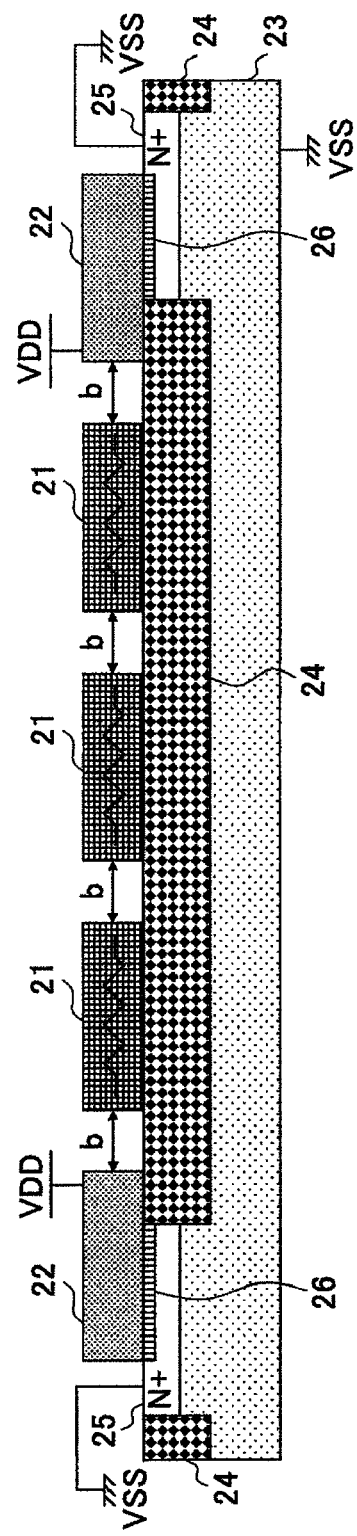
FIG. 4 is a cross sectional view of the resistor-element unit illustrated in FIG. 3 as taken along a line A-A'.

FIG. 3 is a plan view illustrating an example of a resistor-element unit of a semiconductor integrated circuit. FIG. 4 is a cross sectional view of the resistor-element unit illustrated in FIG. 3 as taken along a line A-A'.

As illustrated in FIG. 3 and FIG. 4, a resistor-element unit 20 used in the semiconductor integrated circuit includes a P-type substrate 23, oxide layers 24 and 26 formed on the upper surface of the P-type substrate 23, a plurality of polysilicon members 21 and 22 inclusive of capacitor-element polysilicon members 22 and resistor-element polysilicon members 21 arranged in matrix form at constant intervals on the upper surfaces of the oxide layers, and N-type diffusion layers 25 formed in the P-type substrate 23 under the capacitor-element polysilicon members 22 for electrical connection to an interconnect that supplies a power supply voltage VSS. The polysilicon members 21 and 22 are arranged in matrix form at constant intervals, which are an interval "a" in the vertical direction and an interval "b" in the horizontal direction. The capacitor-element polysilicon members 22 are situated at the outermost periphery of the matrix of polysilicon members, and are electrically coupled to interconnects that supply a power supply voltage VDD. Further, the resistor-element polysilicon members 21 are situated in the interior of the matrix of polysilicon members other than the outermost periphery of the matrix.

The resistor-element polysilicon members 21 situated in the interior of the matrix are formed under the same process conditions because each of these polysilicon members has identical positional relationships with the surrounding adjacent polysilicon members. Accordingly, the resistor-element polysilicon members 21 have the same resistor-element characteristics. A desired resistor value can thus be obtained by connecting a desired number of resistor-element polysilicon members 21 in series or in parallel. The resistor-element polysilicon members 21 are used as resistor elements in a circuit (e.g., a RC filter or operational amplifier which will be described later) that is formed on the P-type substrate 23.

The capacitor-element polysilicon members 22 situated at the periphery of the matrix, however, have adjacent polysilicon members only on one side thereof, and, thus, are subjected to different process conditions than the conditions applied to the interior resistor-element polysilicon members 21 which are surrounded by adjacent polysilicon members on the four sides thereof. The capacitor-element polysilicon members 22 are thus not suitable for use as resistor elements. In consideration of this, the capacitor-element polysilicon members 22 are used as a decoupling capacitance for a circuit formed on the P-type substrate 23.

The decoupling capacitance refers to a condenser that is provided for the purpose of suppressing power supply noise occurring in a semiconductor integrated circuit and suppressing electromagnetic interference associated with such noise. When a power supply voltage fluctuates due to the operation of a semiconductor integrated circuit, noise and electromagnetic interference are generated, creating an undesirable effect. A large-capacitance condenser may be inserted between the power supply voltages (i.e., between VDD and VSS) as a decoupling capacitance, thereby suppressing the fluctuation of power supply voltages to reduce the noise.

Further, the oxide layers include the field oxide layer 24 situated under the resistor-element polysilicon members 21 and the capacitor-element oxide layer 26 situated under the capacitor-element polysilicon members 22. As illustrated in FIG. 4, the thickness of the capacitor-element oxide layer 26 may be smaller than the thickness of the field oxide layer 24. The small thickness of the capacitor-element oxide layer 26 may achieve a large capacitance value for the capacitor comprised of the capacitor-element polysilicon members 22, the capacitor-element oxide layer 26, and the N-type diffusion layers 25.

As illustrated in FIG. 4, part of the capacitor-element polysilicon members 22 overlaps the field oxide layer 24. Although not illustrated in the figures, the upper surface of the field oxide layer 24 that is relatively thick is situated at higher elevation than the upper surface of the capacitor-element oxide layer 26 that is relatively thin. If the entirety of the capacitor-element polysilicon members 22 is placed on the capacitor-element oxide layer 26, thus, the vertical position of the capacitor-element polysilicon members 22 may end up being different from the vertical position of the resistor-element polysilicon members 21. In such a structure, the process conditions of the resistor-element polysilicon members 21 adjacent to the capacitor-element polysilicon members 22 end up being different from the process conditions of the interior resistor-element polysilicon members 21 that are surrounded by resistor-element polysilicon members 21 on all four sides thereof. That is, the resistance characteristics of the resistor elements cannot be made identical. Accordingly, it is preferable to have part of the capacitor-element polysilicon members 22 placed on the field oxide layer 24 as illustrated in FIG. 4.

Figure 5:
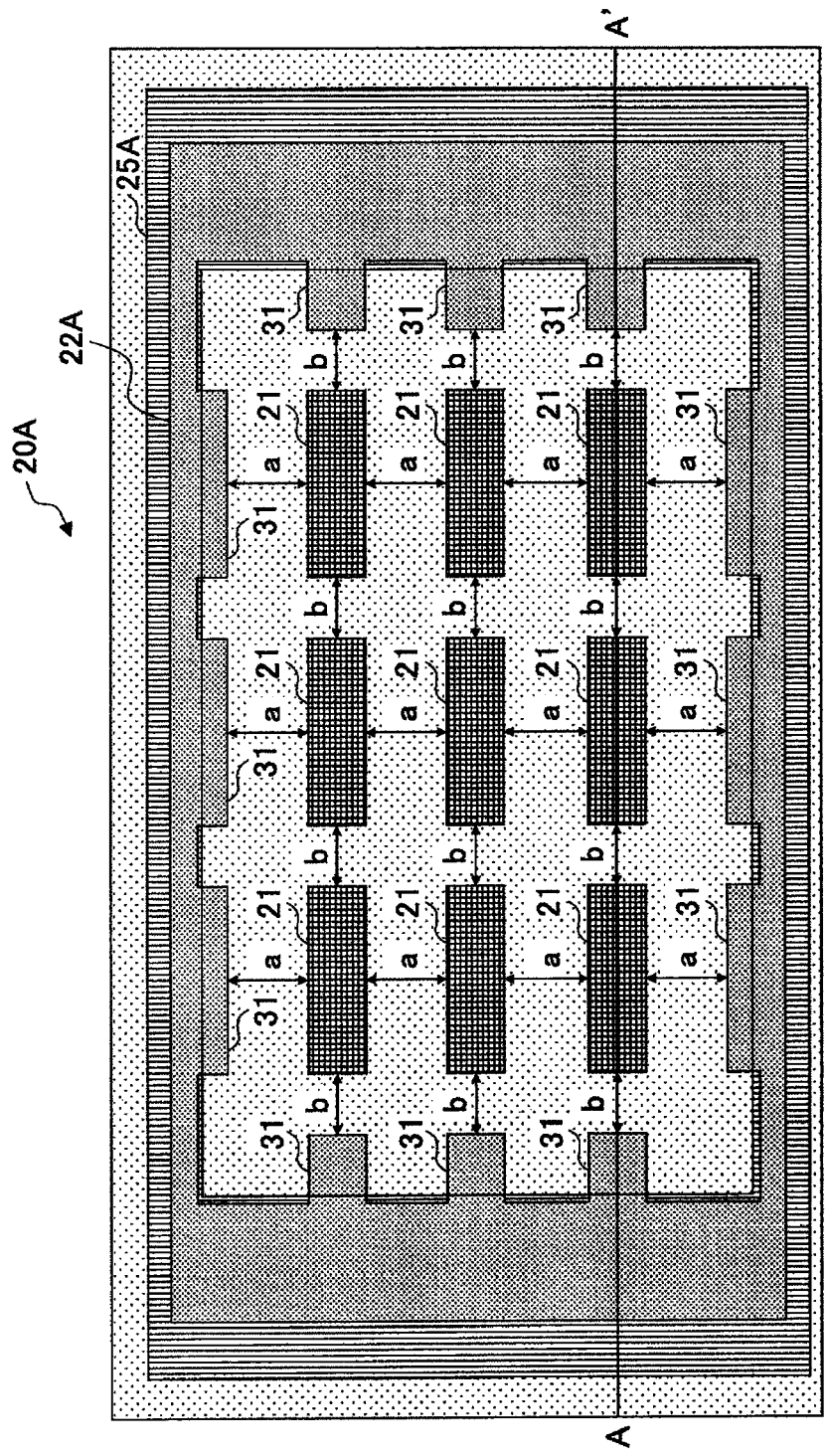
FIG. 5 is a plan view illustrating another example of a resistor-element unit of a semiconductor integrated circuit.

FIG. 5 is a plan view illustrating another example of a resistor-element unit of a semiconductor integrated circuit. In FIG. 5, the same elements as those of FIG. 3 are referred to by the same numerals, and a description thereof will be omitted as appropriate. The cross sectional view of the resistor-element unit illustrated in FIG. 5 as taken along a line A-A' would be identical to what is illustrated in FIG. 4. An illustration and description of such a cross sectional view will be omitted.

Comparison between the configuration illustrated in FIG. 3 and the configuration illustrated in FIG. 5 reveals that the plurality of capacitor-element polysilicon members 22 situated at the outermost periphery in FIG. 3 are consolidated into one capacitor-element polysilicon member 22A in FIG. 5 that has a single unitary structure. Along with this, the plurality of N-type diffusion layers 25 in FIG. 3 are consolidated into one N-type diffusion layer 25A in FIG. 5 that is a single contiguous diffusion layer. With such a configuration, the capacitance value of the capacitor comprised of the capacitor-element polysilicon member, the capacitor-element oxide layer, and the N-type diffusion layer can be increased. That is, the effect of the decoupling capacitance to suppress the fluctuation of power supply voltages is increased.

In FIG. 5, the capacitor-element polysilicon member 22A includes a plurality of projecting portions 31. The projecting portions 31 mimic the shape and arrangement of the capacitor-element polysilicon members 22 illustrated in FIG. 3. The provision of the projecting portions 31 achieves the conditions that a plurality of polysilicon members are arranged at the constant interval "a" in the vertical direction and at the constant interval "b" in the horizontal direction, thereby providing the same process conditions for all the resistor-element polysilicon members 21. In other words, the resistor-element polysilicon members 21 and the projecting portions 31 may be regarded as being a plurality of polysilicon members arranged in matrix form at constant intervals, such that the projecting portions 31 situated at the outermost periphery of the matrix are connected together on the outer side thereof.

Figure 6A:
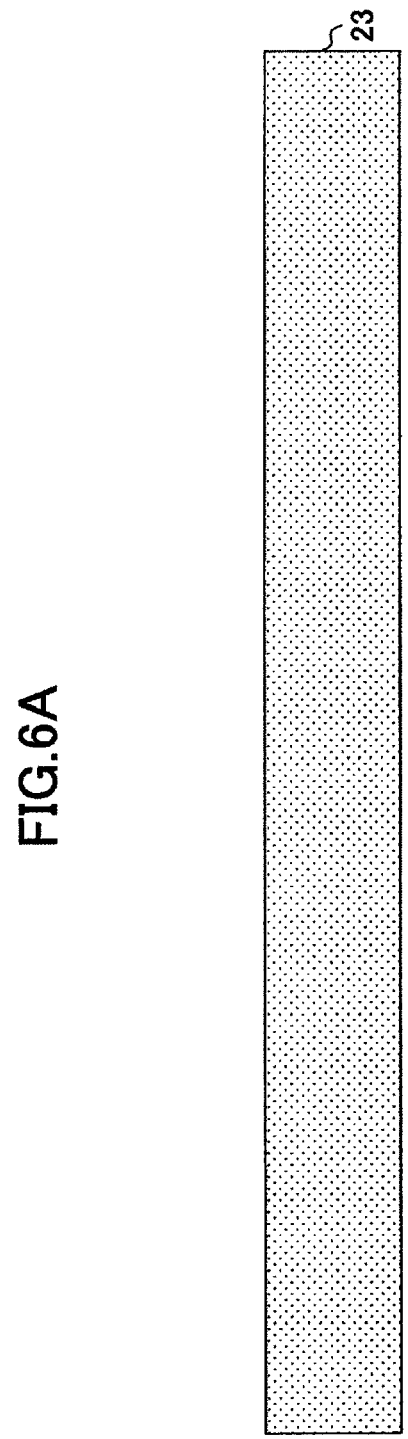
FIG. 6A is a drawing illustrating one of the steps of manufacturing a resistor-element unit of a semiconductor integrated circuit.
Figure 6B:
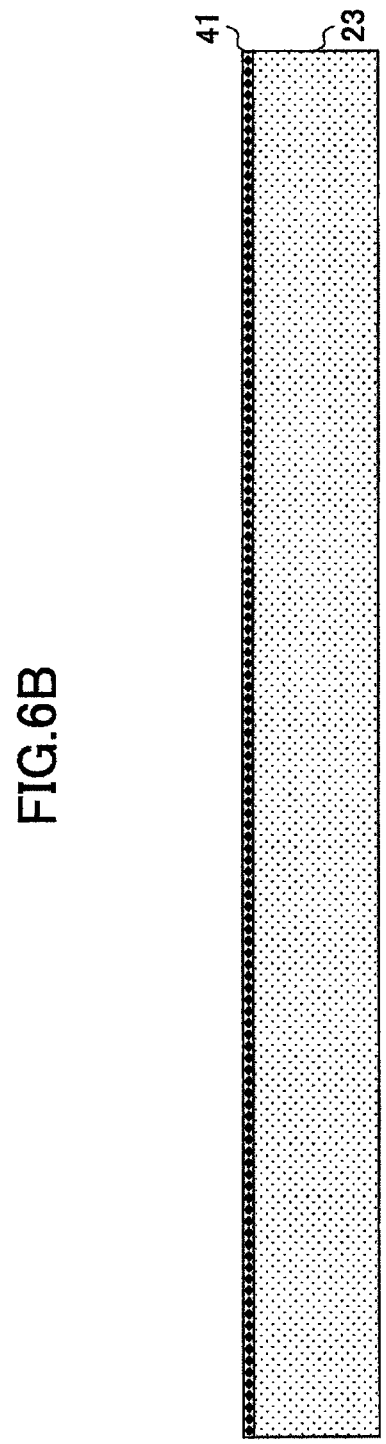
FIG. 6B is a drawing illustrating one of the steps of manufacturing the resistor-element unit of a semiconductor integrated circuit.

FIGS. 6A through 6F are drawings illustrating the steps of manufacturing a resistor-element unit of a semiconductor integrated circuit. In FIG. 6A, the P-type substrate 23 is formed that may be silicon with P-type impurity mixed therein, for example. As illustrated in FIG. 6B, then, an oxide layer 41 is formed on the upper surface of the P-type substrate 23. As illustrated in FIG. 6C, heat treatment is applied after forming resists 42 at the positions where N-type diffusion layers are to be formed, thereby selectively growing the field oxide layer 24.

Figure 6D:
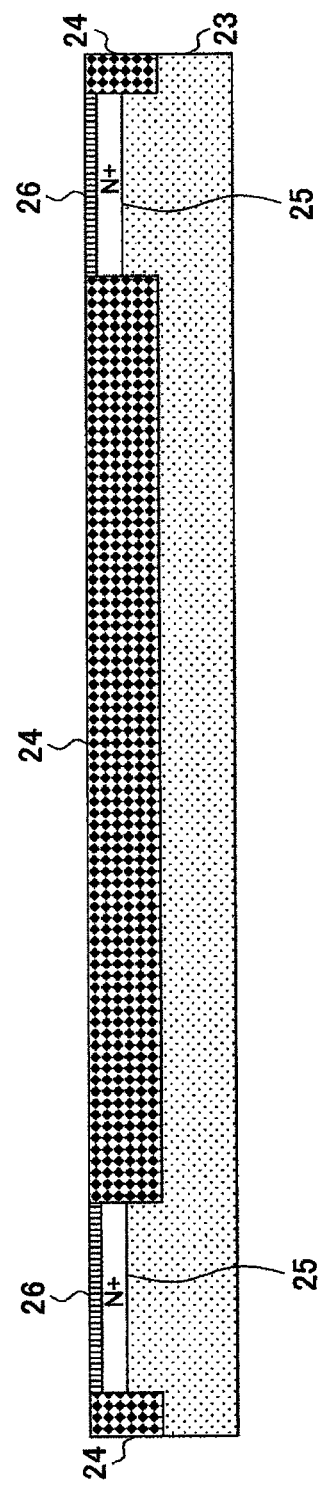
FIG. 6D is a drawing illustrating one of the steps of manufacturing the resistor-element unit of a semiconductor integrated circuit.
Figure 6E:
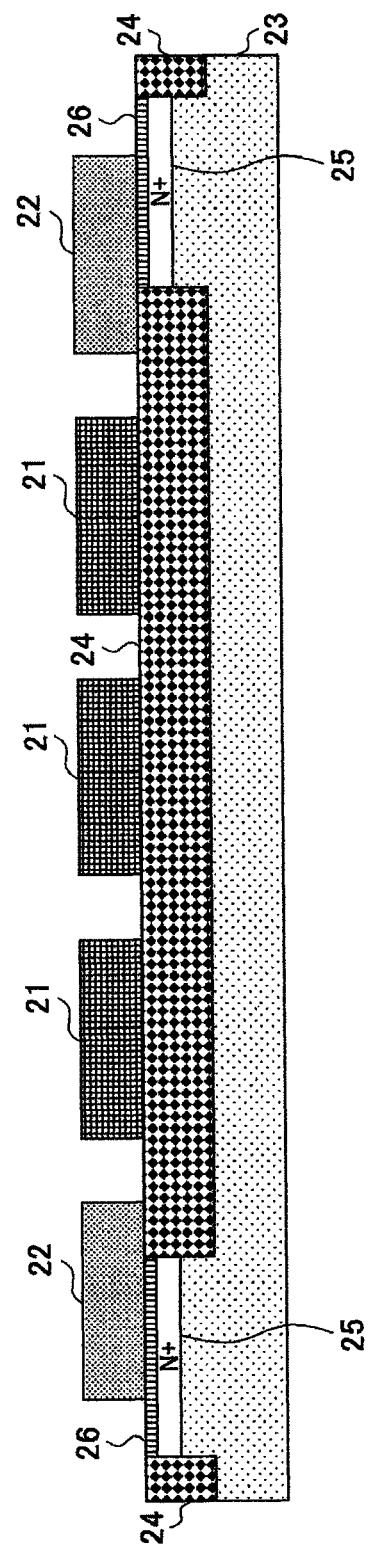
FIG. 6E is a drawing illustrating one of the steps of manufacturing the resistor-element unit of a semiconductor integrated circuit.
Figure 6F:
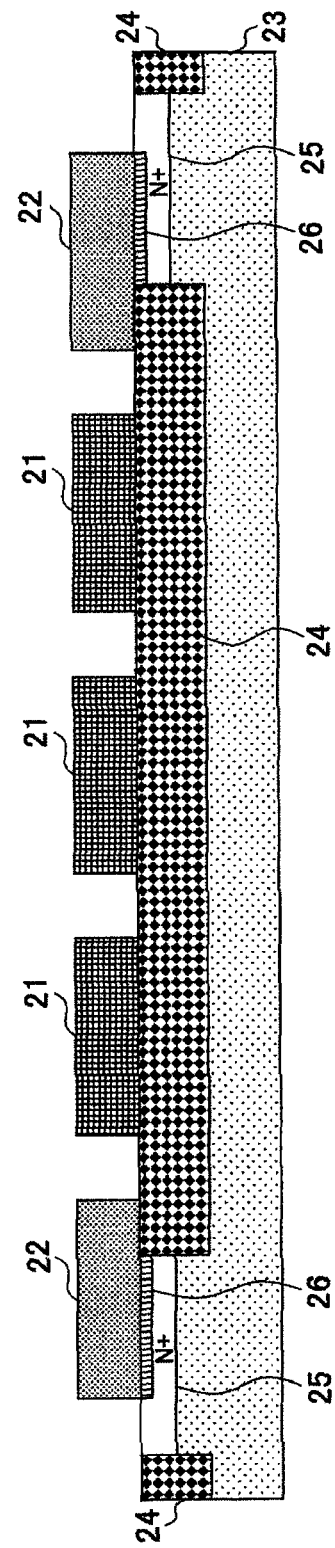
FIG. 6F is a drawing illustrating one of the steps of manufacturing the resistor-element unit of a semiconductor integrated circuit.

As illustrated in FIG. 6D, the N-type diffusion layers 25 are formed by doping impurity after masking the field oxide layer 24 with resists that are formed as appropriate. As illustrated in FIG. 6E, the resistor-element polysilicon members 21 are formed on the field oxide layer 24, and, also, the capacitor-element polysilicon members 22 are formed so as to straddle both the field oxide layer 24 and the capacitor-element oxide layer 26. As illustrated in FIG. 6F, then, part of the capacitor-element oxide layer 26 is removed by etching, thereby exposing the N-type diffusion layers 25.

In the manner as described above, the resistor-element unit of the semiconductor integrated circuit is manufactured.

Figure 7:
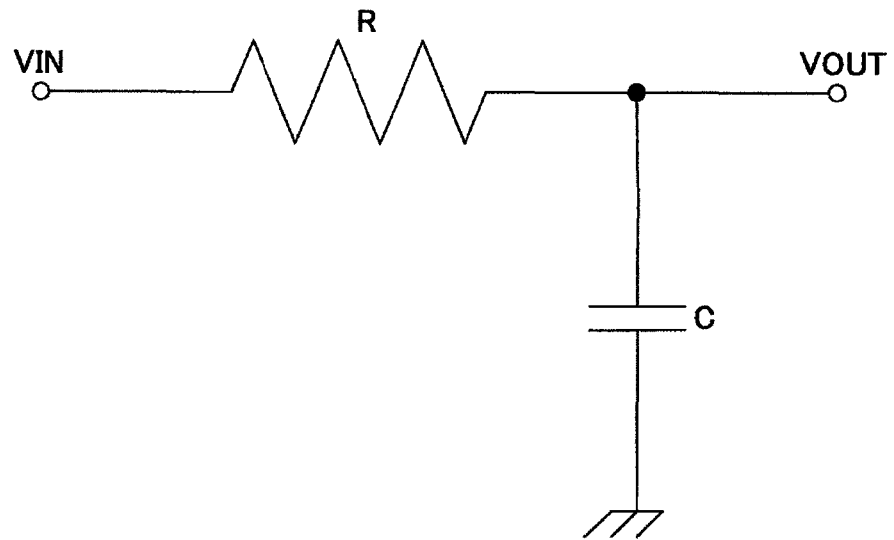
FIG. 7 is a drawing illustrating an example of an equivalent circuit of a portion of the circuit that is implemented in a semiconductor integrated circuit.

FIG. 7 is a drawing illustrating an example of an equivalent circuit of a portion of the circuit that is implemented in a semiconductor integrated circuit. The circuit portion illustrated in FIG. 7 is a low-pass filter including a resistor element R and a capacitor element C. This low-pass filter may be formed on the P-type substrate 23 illustrated in FIG. 4, for example. The resistor-element polysilicon members 21 illustrated in FIG. 3 may be connected in series and/or in parallel to form a resistor element having a desired resistance value. Such a resistor element may then be used as the resistor element R illustrated in FIG. 7. The capacitor-element polysilicon members 22 illustrated in FIG. 3 are used as a decoupling capacitance as previously described. In addition, part of the capacitor-element polysilicon members 22 may be used as the capacitor element C illustrated in FIG. 7.

Figure 8:
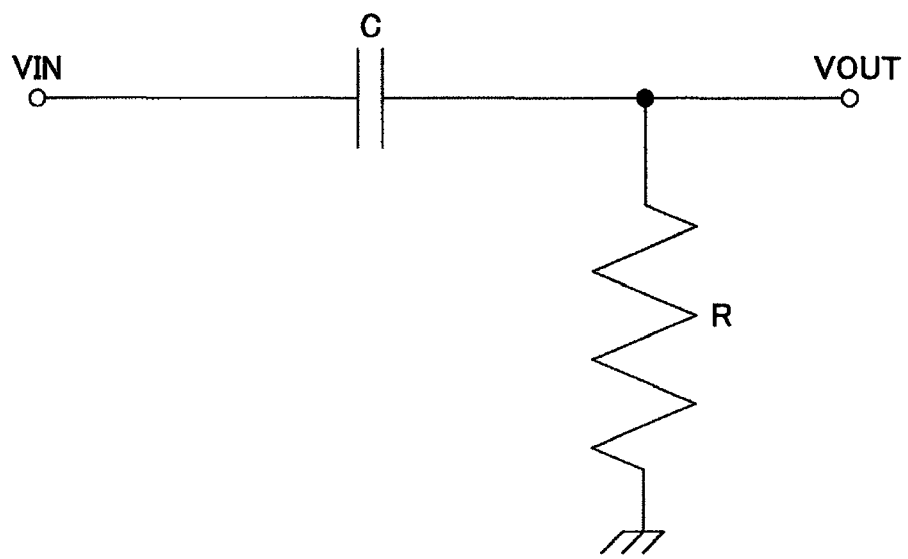
FIG. 8 is a drawing illustrating another example of an equivalent circuit of a portion of the circuit that is implemented in a semiconductor integrated circuit.

FIG. 8 is a drawing illustrating another example of an equivalent circuit of a portion of the circuit that is implemented in a semiconductor integrated circuit. The circuit portion illustrated in FIG. 8 is a high-pass filter including a resistor element R and a capacitor element C. The configurations of the resistor and capacitor elements constituting this high-pass filter may be the same as those described in connection with FIG. 7, and a description thereof will be omitted.

Figure 9:
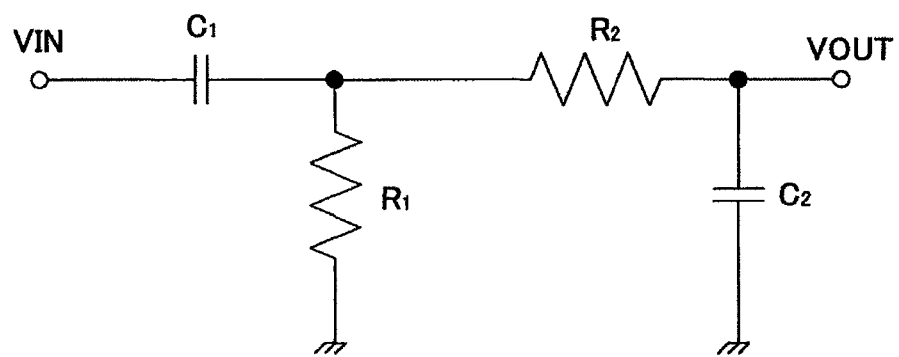
FIG. 9 is a drawing illustrating another example of an equivalent circuit of a portion of the circuit that is implemented in a semiconductor integrated circuit.

FIG. 9 is a drawing illustrating another example of an equivalent circuit of a portion of the circuit that is implemented in a semiconductor integrated circuit. The circuit portion illustrated in FIG. 9 is a band-pass filter including resistor elements $R_1$ and $R_2$ and capacitor elements $C_1$ and $C_2$. This band-pass filter may be formed on the P-type substrate 23 illustrated in FIG. 4, for example. The resistor-element polysilicon members 21 illustrated in FIG. 3 may be connected in series and/or in parallel to form resistor elements having respective desired resistance values. Such resistor elements may then be used as the resistor elements $R_1$ and $R_2$ illustrated in FIG. 9. The capacitor-element polysilicon members 22 illustrated in FIG. 3 are used as a decoupling capacitance as previously described. In addition, part of the capacitor-element polysilicon members 22 may be used as at least one of the capacitor elements $C_1$ and $C_2$ illustrated in FIG. 9.

Figure 10:
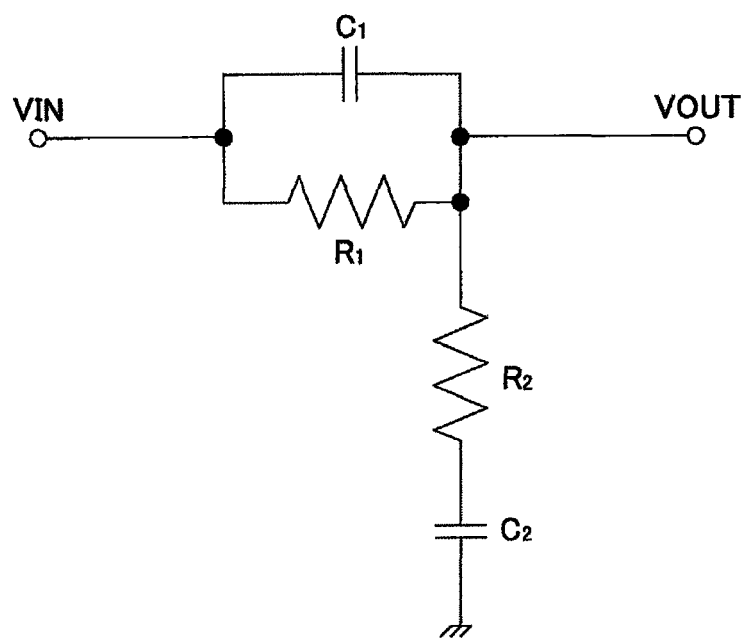
FIG. 10 is a drawing illustrating another example of an equivalent circuit of a portion of the circuit that is implemented in a semiconductor integrated circuit.

FIG. 10 is a drawing illustrating another example of an equivalent circuit of a portion of the circuit that is implemented in a semiconductor integrated circuit. The circuit portion illustrated in FIG. 10 is a band-elimination filter including resistor elements $R_1$ and $R_2$ and capacitor elements $C_1$ and $C_2$. The configurations of the resistor and capacitor elements constituting this band-elimination filter may be the same as those described in connection with FIG. 9, and a description thereof will be omitted.

Figure 11:
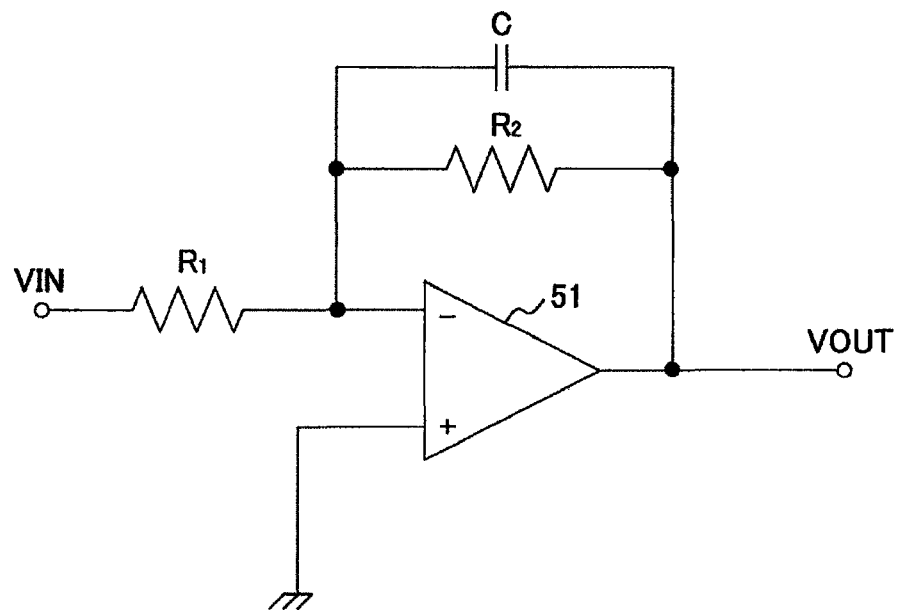
FIG. 11 is a drawing illustrating another example of an equivalent circuit of a portion of the circuit that is implemented in a semiconductor integrated circuit.

FIG. 11 is a drawing illustrating another example of an equivalent circuit of a portion of the circuit that is implemented in a semiconductor integrated circuit. The circuit portion illustrated in FIG. 11 is a low-pass filter including resistor elements $R_1$ and $R_2$, a capacitor element C, and an operational amplifier 51. This low-pass filter may be formed on the P-type substrate 23 illustrated in FIG. 4, for example. A set of transistors constituting the operational amplifier 51 may be provided by forming diffusion layers in the P-type substrate 23 and by forming gate oxide films and gates on the P-type substrate 23. Further, the resistor-element polysilicon members 21 illustrated in FIG. 3 may be connected in series and/or in parallel to form resistor elements having respective desired resistance values. Such resistor elements may then be used as the resistor elements $R_1$ and $R_2$ illustrated in FIG. 11. The capacitor-element polysilicon members 22 illustrated in FIG. 3 are used as a decoupling capacitance as previously described. In addition, part of the capacitor-element polysilicon members 22 may be used as the capacitor element C illustrated in FIG. 11.

Figure 12:
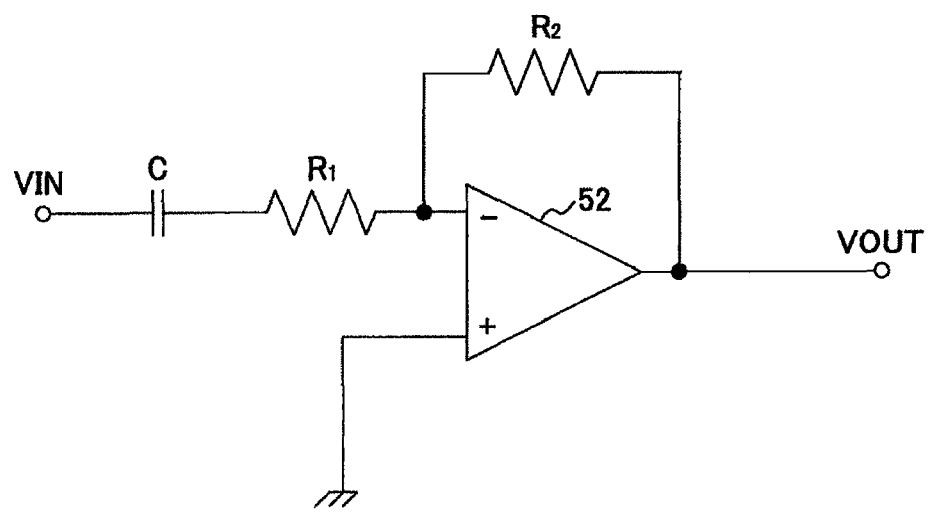
FIG. 12 is a drawing illustrating another example of an equivalent circuit of a portion of the circuit that is implemented in a semiconductor integrated circuit.

FIG. 12 is a drawing illustrating another example of an equivalent circuit of a portion of the circuit that is implemented in a semiconductor integrated circuit. The circuit portion illustrated in FIG. 12 is a high-pass filter including resistor elements $R_1$ and $R_2$, a capacitor element C, and an operational amplifier 52. The configurations of the circuit elements such as resistors, capacitors, and transistors may be the same as those described in connection with FIG. 11, and a description thereof will be omitted.

Figure 13:
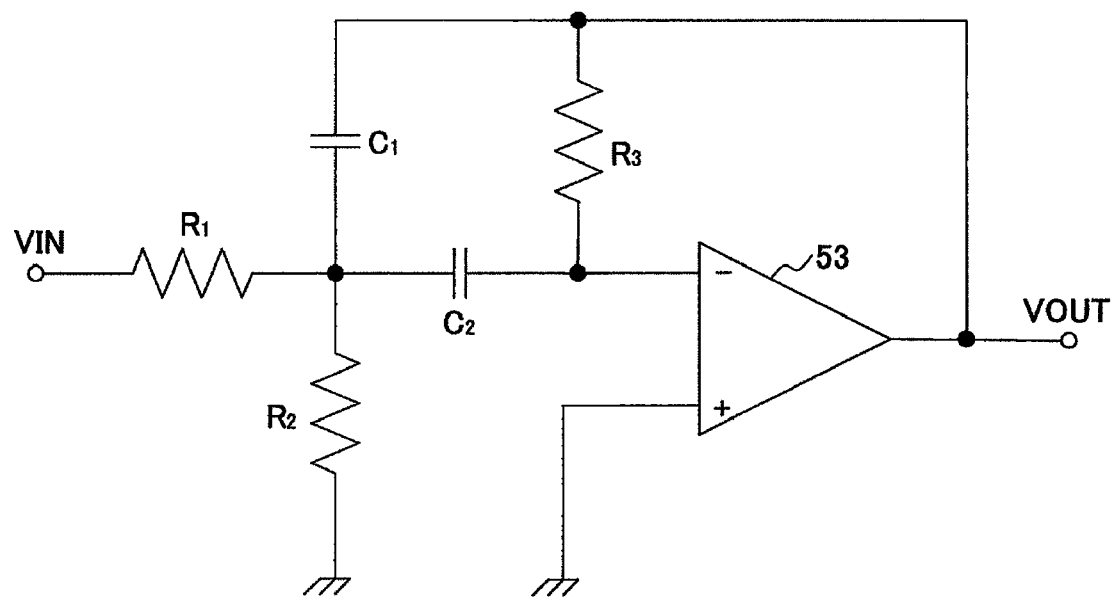
FIG. 13 is a drawing illustrating another example of an equivalent circuit of a portion of the circuit that is implemented in a semiconductor integrated circuit.

FIG. 13 is a drawing illustrating another example of an equivalent circuit of a portion of the circuit that is implemented in a semiconductor integrated circuit. The circuit portion illustrated in FIG. 13 is a band-pass filter including resistor elements $R_1$ through $R_3$, capacitor elements $C_1$ and $C_2$, and an operational amplifier 53. This band-pass filter may be formed on the P-type substrate 23 illustrated in FIG. 4, for example. A set of transistors constituting the operational amplifier 53 may be provided by forming diffusion layers in the P-type substrate 23 and by forming gate oxide films and gates on the P-type substrate 23. Further, the resistor-element polysilicon members 21 illustrated in FIG. 3 may be connected in series and/or in parallel to form resistor elements having respective desired resistance values. Such resistor elements may then be used as the resistor elements $R_1$ through $R_3$ illustrated in FIG. 13. The capacitor-element polysilicon members 22 illustrated in FIG. 3 are used as a decoupling capacitance as previously described. In addition, part of the capacitor-element polysilicon members 22 may be used as at least one of the capacitor elements $C_1$ and $C_2$ illustrated in FIG. 13.

Figure 14:
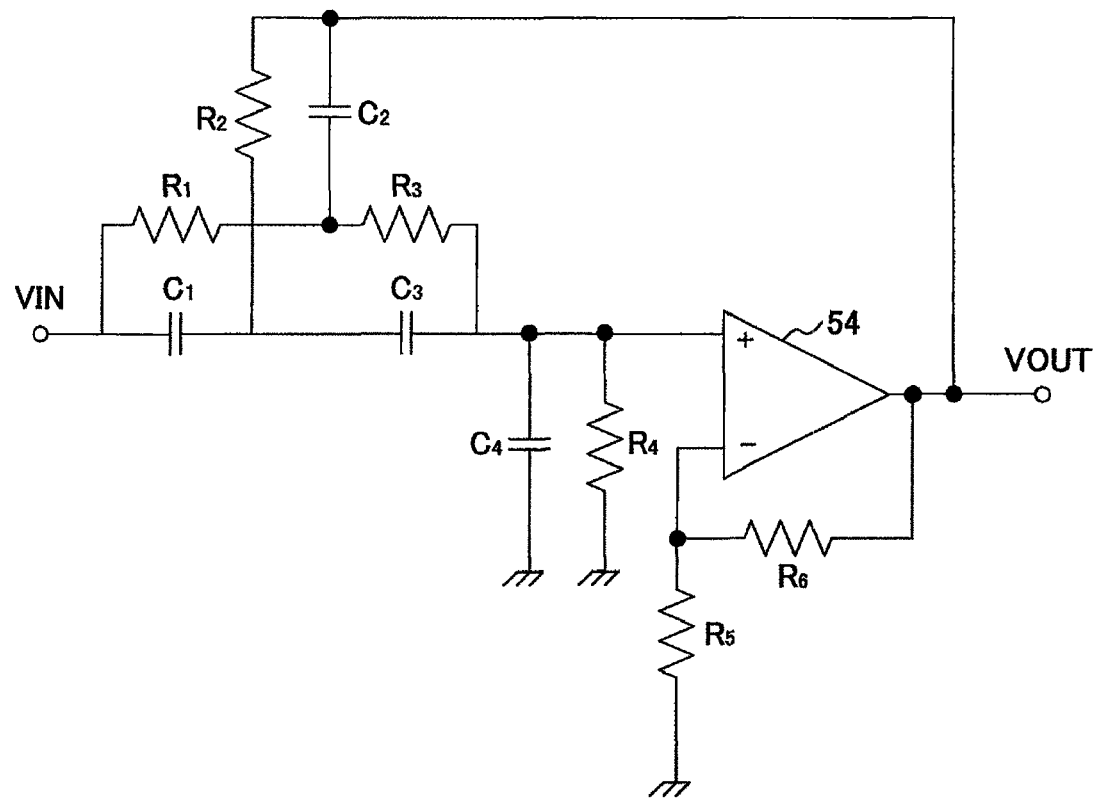
FIG. 14 is a drawing illustrating another example of an equivalent circuit of a portion of the circuit that is implemented in a semiconductor integrated circuit.

FIG. 14 is a drawing illustrating another example of an equivalent circuit of a portion of the circuit that is implemented in a semiconductor integrated circuit. The circuit portion illustrated in FIG. 14 is a band-elimination filter including resistor elements $R_1$ through $R_6$, capacitor elements $C_1$ through $C_4$, and an operational amplifier 54. The configurations of the circuit elements such as resistors, capacitors, and transistors may be the same as those described in connection with FIG. 13, and a description thereof will be omitted.

Figure 15:
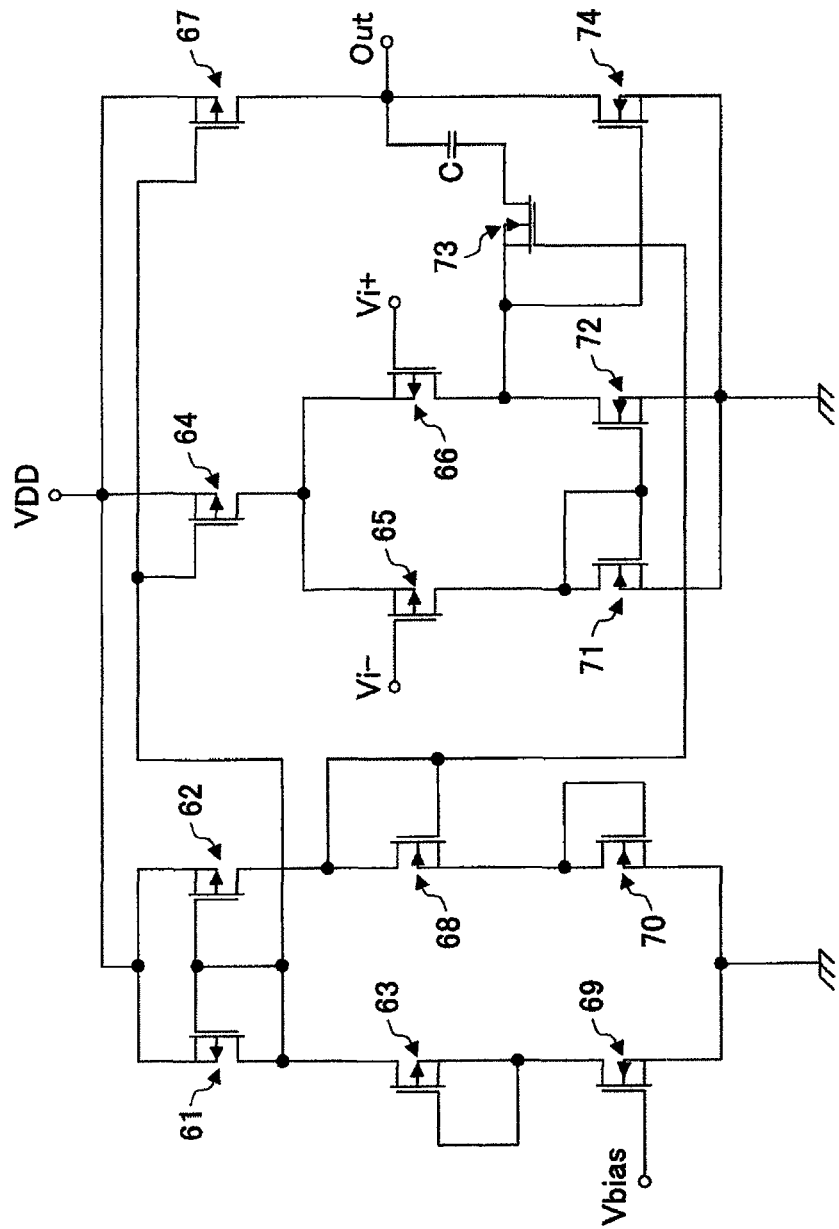
FIG. 15 is a drawing illustrating another example of an equivalent circuit of a portion of the circuit that is implemented in a semiconductor integrated circuit.

FIG. 15 is a drawing illustrating another example of an equivalent circuit of a portion of the circuit that is implemented in a semiconductor integrated circuit. The circuit portion illustrated in FIG. 15 is an operational amplifier, which includes PMOS transistors 61 through 67, NMOS transistors 68 through 74, and a capacitor element C. This operational amplifier may be formed on the P-type substrate 23 illustrated in FIG. 4, for example. Namely, the PMOS transistors 61 through 67 and the NMOS transistors 68 through 74 constituting the operational amplifier may be provided by forming diffusion layers or both N wells and diffusion layers as needed in the P-type substrate 23 and by forming gate oxide films and gates on the P-type substrate 23. The capacitor-element polysilicon members 22 illustrated in FIG. 3 are used as a decoupling capacitance as previously described. In addition, part of the capacitor-element polysilicon members 22 may be used as the capacitor element C illustrated in FIG. 11. Further, the resistor-element polysilicon members 21 illustrated in FIG. 3 may be connected in series and/or in parallel to form resistor elements having respective desired resistance values. Such resistor elements may then be used in other circuit portions different from the circuit portion illustrated in FIG. 15. For example, the operational amplifier illustrated in FIG. 15 may be used as the operational amplifier 51 illustrated in FIG. 11, and the resistor elements $R_1$ and $R_2$ connected to the operational amplifier 51 may be implemented by use of the resistor-element polysilicon members 21.

According to at least one embodiment, a plurality of polysilicon members are arranged in a matrix, so that a first polysilicon member situated at the outermost periphery of the matrix is coupled to a second power supply voltage, and a diffusion layer opposed to the first polysilicon member across an oxide layer is coupled to a first power supply voltage. With this arrangement, the first polysilicon member, the diffusion layer, and the oxide layer situated between the first polysilicon member and the diffusion layer may constitute a decoupling capacitance for use with the semiconductor integrated circuit. In this manner, excess polysilicon members unused in the related-art configuration may be utilized as a decoupling capacitor, thereby reducing needless elements and areas.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor integrated circuit, comprising:
   a substrate;
   an oxide layer comprising a first oxide layer and a second oxide layer, wherein the first oxide layer is formed in direct contact with the substrate;
   a plurality of polysilicon members arranged at constant intervals in a matrix on the oxide layer and including at least one first polysilicon member and a plurality of second polysilicon members; and
   a diffusion layer formed in the substrate under the first polysilicon member and electrically coupled to an interconnect which supplies a first power supply voltage,
   wherein the first polysilicon member is situated at an outermost periphery of the matrix and electrically coupled to an interconnect which supplies a second power supply voltage, and the plurality of second polysilicon members are situated inside the outermost periphery of the matrix,
   wherein the second oxide layer is situated under the second polysilicon members and the first oxide layer is situated under the first polysilicon member, and a thickness of the first oxide layer is smaller than a thickness of the second oxide layer.

2. The semiconductor integrated circuit as claimed in claim 1, wherein the first polysilicon member, the diffusion layer, and the oxide layer situated between the first polysilicon member and the diffusion layer constitute a decoupling capacitance.

3. The semiconductor integrated circuit as claimed in claim 1, wherein the first polysilicon member is a single member having an integral unitary structure that is configured by connecting outermost periphery members of the plurality of polysilicon members arranged at the constant intervals in said matrix such that the outermost periphery members are connected via polysilicon on an outer side thereof.

4. The semiconductor integrated circuit as claimed in claim 1, wherein the first polysilicon member and the second polysilicon members are formed in the same production process step.

5. A semiconductor integrated circuit, comprising:
   a substrate;
   an oxide layer formed on the substrate;
   a plurality of polysilicon members arranged at constant intervals in a matrix on the oxide layer and including at least one first polysilicon member and a plurality of second polysilicon members; and a diffusion layer formed in the substrate under the first polysilicon member and electrically coupled to an interconnect which supplies a first power supply voltage, wherein the first polysilicon member is situated at an outermost periphery of the matrix and electrically coupled to an interconnect which supplies a second power supply voltage, and the plurality of second polysilicon members are situated inside the outermost periphery of the matrix, wherein the oxide layer includes a second oxide layer situated under the second polysilicon members and a first oxide layer situated under the first polysilicon member, and a thickness of the first oxide layer is smaller than a thickness of the second oxide layer, wherein at least one of the plurality of second polysilicon members is a resistor element of a circuit implemented on the substrate.

6. A semiconductor integrated circuit, comprising:
a substrate;
an oxide layer formed on the substrate;
a plurality of polysilicon members arranged at constant intervals in a matrix on the oxide layer and including at least one first polysilicon member and a plurality of second polysilicon members; and
a diffusion layer formed in the substrate under the first polysilicon member and electrically coupled to an interconnect which supplies a first power supply voltage,
wherein the first polysilicon member is situated at an outermost periphery of the matrix and electrically coupled to an interconnect which supplies a second power supply voltage, and the plurality of second polysilicon members are situated inside the outermost periphery of the matrix,
the semiconductor integrated circuit further comprising a filter circuit, wherein the filter circuit includes:
a resister element; and
a capacitor element,
wherein at least one of the plurality of second polysilicon members is used as the resistor element.

7. The semiconductor integrated circuit as claimed in claim 6, wherein part of the polysilicon members situated at the outermost periphery of the matrix is used as the capacitor element.

8. The semiconductor integrated circuit as claimed in claim 6, wherein the filter circuit further includes an operational amplifier including a phase-compensation capacitor, wherein part of the polysilicon members situated at the outermost periphery of the matrix is used as the phase-compensation capacitor.

9. A semiconductor integrated circuit, comprising:
a substrate;
an oxide layer formed on the substrate;
a plurality of polysilicon members arranged at constant intervals in a matrix on the oxide layer and including at least one first polysilicon member and a plurality of second polysilicon members; and
a diffusion layer formed in the substrate under the first polysilicon member and electrically coupled to an interconnect which supplies a first power supply voltage,
wherein the first polysilicon member is situated at an outermost periphery of the matrix and electrically coupled to an interconnect which supplies a second power supply voltage, and the plurality of second polysilicon members are situated inside the outermost periphery of the matrix,
the semiconductor integrated circuit further comprising an operational amplifier including a phase-compensation capacitor, wherein part of the polysilicon members situated at the outermost periphery of the matrix is used as the phase-compensation capacitor.

10. A semiconductor integrated circuit, comprising:
a substrate;
an oxide layer formed on the substrate;
a plurality of polysilicon members arranged at constant intervals in a matrix on the oxide layer and including at least one first polysilicon member and a plurality of second polysilicon members; and
a diffusion layer formed in the substrate under the first polysilicon member and electrically coupled to an interconnect which supplies a first power supply voltage,
wherein the first polysilicon member is situated at an outermost periphery of the matrix and electrically coupled to an interconnect which supplies a second power supply voltage, and the plurality of second polysilicon members are situated inside the outermost periphery of the matrix,
wherein the oxide layer includes a second oxide layer situated under the second polysilicon members and a first oxide layer situated under the first polysilicon member, and a thickness of the first oxide layer is smaller than a thickness of the second oxide layer,
wherein the first oxide layer and the second oxide layer are in physical contact with each other.

11. A semiconductor integrated circuit, comprising:
a substrate;
an oxide layer formed on the substrate;
a plurality of polysilicon members arranged at constant intervals in a matrix on the oxide layer and including at least one first polysilicon member and a plurality of second polysilicon members; and
a diffusion layer formed in the substrate under the first polysilicon member and electrically coupled to an interconnect which supplies a first power supply voltage,
wherein the first polysilicon member is situated at an outermost periphery of the matrix and electrically coupled to an interconnect which supplies a second power supply voltage, and the plurality of second polysilicon members are situated inside the outermost periphery of the matrix,
wherein the oxide layer includes a second oxide layer situated under the second polysilicon members and a first oxide layer situated under the first polysilicon member, and a thickness of the first oxide layer is smaller than a thickness of the second oxide layer,
wherein each of the first oxide layer and the second oxide layer is in direct contact with the substrate.

* * * * *